United States Patent [19]

Bellis et al.

[11] 4,002,778

[45] Jan. 11, 1977

[54] CHEMICAL PLATING PROCESS

[75] Inventors: Harold E. Bellis; Donald E. Booker, both of Wilmington, Del.

[73] Assignee: E. I. Du Pont de Nemours and Company, Wilmington, Del.

[22] Filed: Dec. 15, 1975

[21] Appl. No.: 641,134

Related U.S. Application Data

[63] Continuation-in-part of Ser. No. 388,648, Aug. 15, 1973, abandoned.

[52] U.S. Cl. ............................ 427/98; 427/265; 427/266; 427/404; 427/304; 427/305; 427/306; 427/437; 427/438

[51] Int. Cl.² ......................................... C23C 3/02

[58] Field of Search ............ 427/98, 265, 266, 404, 427/304, 305, 306, 437, 438

[56] References Cited

UNITED STATES PATENTS

| | | | |
|---|---|---|---|
| 3,148,072 | 9/1964 | West et al. | 427/438 |
| 3,426,427 | 2/1969 | Dugan | 427/306 |
| 3,574,664 | 4/1971 | Feldstein | 427/345 |
| 3,667,991 | 6/1972 | Miller | 427/438 |
| 3,799,816 | 3/1974 | Schneble et al. | 427/438 |

FOREIGN PATENTS OR APPLICATIONS

| | | | |
|---|---|---|---|
| 842,826 | 7/1970 | United Kingdom | 427/304 |

*Primary Examiner*—Ralph S. Kendall

[57] ABSTRACT

A process for chemical plating of nickel or cobalt onto materials otherwise noncatalytic to the plating baths by pretreating the materials with a reducing agent such as sodium borohydride or dimethylamine borane prior to chemical plating. Treating the material with an oxidizing agent prior to the pretreatment is also useful, especially for plating copper. The invention is particularly desirable for plating nickel onto copper conductor patterns on polymeric substrate circuit boards. The copper is plated with nickel, and the substrate is not.

20 Claims, No Drawings

CHEMICAL PLATING PROCESS

CROSS-REFERENCE TO RELATED APPLICATION

This is a continuation-in-part of application Ser. No. 388,648, filed Aug. 15, 1973 for the same inventors and assigned to the assignee of the present invention now abandoned.

BACKGROUND OF THE INVENTION

This invention relates to chemical reductive plating or electroless plating of nickel or cobalt. More particularly, it relates to such plating onto surfaces of materials which are normally noncatalytic to the plating bath. Such materials include copper; chromium-containing stainless steels; Kovar alloy of iron, nickel and cobalt; silver; electrically conductive molymanganese and tin oxide-antimony oxide compositions; and other materials.

The chemical deposition of nickel or cobalt onto such surfaces can be accomplished by contacting the surface with an active metal, such as steel or aluminum, or by impressing a small cathodic potential, or by prior treatment in acid palladium chloride solution. These methods have disadvantages especially if the metal surfaces exist as discrete isolated areas, such as on printed circuit boards.

The use of steel shot rolled or tumbled over the surface can activate isolated areas, but as the number of areas per board increases and the areas become smaller, larger amounts of shot are required, and the proportion of useful coating decreases. It is not unusual to use and plate 20 square feet of shot to plate 0.2 square foot of circuit pattern in 100% yield. Also, steel racks can provide the local catalytic activity needed to commence plating on a continuous sheet of a metal such as copper. Of course, the rack would not normally touch all the areas to be plated on a circuit board, and so, this approach would not be effective for such plating.

Application of an electrical potential also activates these surfaces but requires special care in design and application to insure 100% activation and is difficult to use for discontinuous patterns, such as in the plating of conductors on circuit boards. Palladium treatment generally activates these surfaces, but it also activates ceramic or plastic surfaces on which metal is deposited, and this degrades quality with shorting between conductor pads.

Electroless or chemical reductive plating of nickel and cobalt is well known and described in the literature and in many patents. Among the informative patents are the following which are hereby incorporated by reference:

U.S. Pat. No. 3,096,182, granted July 2, 1963, to Berzins, describes the use of alkali metal borohydrides as the reducing agents in chemical plating baths. U.S. Pat. No. 3,338,726, granted Aug. 29, 1967 to Berzins, concerns the use of amine boranes as the reducing agents. U.S. Pat. No. 3,738,849 granted June 12, 1973, to Bellis is concerned with the use of alkali metal cyanoborohydrides in electroless plating. Each of these patents is assigned to the assignee of the present invention. U.S. Pat. No. 3,295,999 granted Jan. 3, 1967, to Klein and Zirngiebl also gives further background on these materials. These patents utilize boron compounds as the reducing agent, leading to the incorporation of boron in the nickel or cobalt coating, as described in U.S. Pat. No. 3,045,334, granted July 24, 1962 to Berzins and U.S. Pat. No. 3,674,447, granted July 4, 1972 to Bellis (including thallium in the coating), both of which are assigned to the assignee of the present invention.

The use of hypophosphite reducing agents is also well known. A discussion of this technology is presented in "Modern Electroplating", ed. F. A. Lowenheim, pages 699 to 708, published by John Wiley & Sons, Inc., 1968.

Dimethylamine borane and sodium hypophosphite solutions have been used to maintain prepared aluminum surfaces after appropriate treatments and prior to nickel or cobalt chemical plating, as described in U.S. Pat. No. 3,667,991—Miller, issued June 6, 1972. However, aluminum is normally catalytic to chemical plating baths, and the function of these solutions is to minimize oxide formation and permit a more uniform and adherent coating to be formed. In that application, dimethylamine borane and sodium hypophosphite are considered to be equivalent, and aluminum is receptive to nickel or cobalt electroless plating without exposure to these solutions.

SUMMARY OF THE INVENTION

The present invention, in certain of its embodiments, provides a process for plating nickel or cobalt by chemical reduction of a plating bath onto the surface of an electrically conducting material which is normally noncatalytic to the plating bath, except when treated in accordance with the present invention, which process comprises contacting the surface prior to said plating with a pretreating solution of a reducing agent selected from the group consisting of alkali metal borohydrides, alkali metal cyanoborohydrides, and amine boranes, and then contacting the surface with the plating bath to cause the chemical reduction of nickel onto the surface. When an alkali metal borohydride is used for the pretreating solution, the plating bath also uses an alkali metal borohydride as the reducing agent.

When nickel plating on copper, especially in the form of conductor patterns on polymeric or plastic circuit boards or on ceramic substrates, preferred practice includes preliminary treatment in an oxidizing solution of ammonium persulfate to slightly etch the surface, followed by pretreatment in an aqueous solution of at least about 0.5 and preferably from 1 to 20 grams/liter dimethylamine borane at a temperature between 25° and 65° C. and at a pH between 3.5 and 11.0. The thus treated body is then electrolessly coated by conventional techniques without any effective rinsing of the reducing agent from the body. No electroless plating takes place on the plastic circuit board or ceramic substrate. Diethylamine borane in a suitable alternative for dimethylamine borane.

Electrically conductive materials which are generally noncatalytic to the plating baths but which can be used with the present invention include copper and copper-based alloys containing at least 50% copper, iron-based alloys containing at least about 50% iron and 12% chromium, an iron-based alloy containing about 29% nickel, 17% cobalt, and the balance essentially iron, silver, sintered, fritted compositions of oxide powders and at least one metal selected from the group consisting of gold, silver, platinum and alloys containing at least 50% of one or more of such metals, tin oxide with a small but effective amount of antimony oxide compositions to increase electrical conductivity, and a sintered powder composition consisting essentially of molybdenum and manganese oxide. Some compositions of gold powder in frits, particularly frits containing bismuth oxide, are noncatalytic to the plating baths. These, as well as similar compositions of noble metals such as platinum and silver alloys, are included among substrates on which the invention is useful. Palladium is normally catalytic to the plating baths. Percentages herein are by weight except where indicated otherwise.

DESCRIPTION OF THE PREFERRED EMBODIMENTS

In the following description, samples of various metals were plated in accordance with the invention. The nickel-boron plating systems were of two types.

The amine borane plating system used a plating bath in distilled water of the following composition:

| | |
|---|---|
| nickel acetate | 50 g/l |
| lactic acid | 25 g/l |
| sodium citrate | 25 g/l |
| thiodiglycolic acid | 0.1 g/l |
| dimethylamine borane | 2.5 g/l |
| wetting agent | 0.1 g/l |

The bath was operated at a pH of 6.5, obtained by adjusting with ammonia, and at a temperature in the range of 55° to 65° C., with stirring. Although various wetting agents can be used, the one used was an anionic surfactant linear dodecylbenzene sodium sulfonate sold by Monsanto Chemical Co. as "Santomers S". Other suitable amine boranes are described in the above mentioned U.S. Pat. Nos. 3,338,726 and 3,295,999. Dimethylamine borane and diethylamine borane are both particularly suitable.

The sodium borohydride plating systems used a plating bath in distilled water of the following composition:

| | |
|---|---|
| nickel chloride hexahydrate | 30 g/l |
| ethylenediamine | 60 g/l |
| sodium hydroxide | 40 g/l |
| sodium borohydride | 0.3 g/l |
| thallium sulfate | 50 mg/l |

The bath was operated at pH 14 and 92° C. with stirring.

The metals plated included copper, Type 316 stainless steel (17% Cr, 12% N, 2.5% Mo, balance Fe), Kovar alloy (29% Ni, 17% Co, 0.3% Mn, balance Fe), silver in a glass frit in the form of an electrically conducting metallization, chemically deposited tin oxide containing 2% antimony oxide which is an amount effective to make it electrically conductive, and molybdenum-manganese-oxide metallizations. The last three compositions were on a ceramic substrate. The others were either in the form of metal coupons or as conductive patterns on a plastic circuit board. Molybdenum-manganese-oxide metallizations are made by heating a frit of molybdenum and manganese powder in wet hydrogen. The manganese is oxidized, and it forms useful compounds such as spinels on ceramic substrates including alumina or beryllia. This technology is well known in the art and is described in "Ceramic to Metal Bonding", Helgesson, Boston Technical Publishers, Inc., (1968). Silver can be used as a conductor on circuit boards on various forms. In one desirable form, it is present as a powder in a glass frit. Descriptions of such applications are presented in U.S. Pat. Nos. 2,819,170—Short and U.S. Pat. No. 2,822,279—Larsen and Short, both granted in 1958 as well as in U.S. Pat. No. 2,385,580—Knox, granted in 1945. All are assigned to the assignee of the present invention. These patents are incorporated herein by reference.

Because even very small amounts of alkali metal borohydride carried over from the pretreatment into an amine borane plating bath can cause decomposition of the bath at the surface of the part being plated with consequent plating over the entire surface, use of the alkali metal borohydride pretreatment is confined to applications in which the plating bath uses an alkali metal borohydride reducing agent. This prevents possibilities of shorting out circuit patterns.

We have found that brief immersions of these materials in dilute aqueous dimethylamine borane solutions followed promptly and without drying by immersion in electroless nickel or cobalt baths results in initiation of plating within a minute, whereas in the absence of amine borane treatment no coating takes place. The concentration of amine borane in water can be from as low as 1 gram/liter to 20 grams/liter. Immersion times as short as 15 seconds are possible. Solution temperature preferably is from 25° to 65° C. The pH of the solution should be between 3.5 and 11.0. In certain circumstances, such as in the presence of lactic acid, a pH range of 7 to 11 is preferable. Material left on the surface after immersion in the dimethylamine borane should not be rinsed off the surface.

The mechanism by which the invention operates is not known, and the invention should not be limited by or tied to any particular theory of operation. However, the process of the invention may possibly result in weak adsorption of amine borane in effective amounts to initiate plating, it may operate by creating active sites and preventing their reoxidation, or other unknown mechanisms may be involved.

The condition of the metal prior to treatment with amine borane can influence the degree of initiation. The surface must be in a condition that is receptive to amine borane adsorption. In the case of copper, prior etching in ammonium persulfate is beneficial.

Conductors plated in this manner show no activation of ceramic or plastic surfaces and essentially no spreading of conductor lanes, while exhibiting good adhesion and complete coverage.

It is interesting to note that other commonly used reducing agents such as hydrazine, sodium hypophosphite and formaldehyde are not effective in promoting coating of copper when used in place of amine boranes. The treatment in an amine borane carries some of the amine borane into the electroless bath, and this tends to reduce replenishment requirements. This can be beneficial.

EXAMPLE 1

A glass epoxy board with a copper circuit pattern was treated for 30 seconds in 20% ammonium persulfate solution at room temperature. The copper was uniformly etched and was a uniform pink color. The board was rinsed thoroughly so as to carry no ammonium persulfate into the amine borane solution. The board was treated for 2 minutes in a 0.2% dimethylamine borane solution at room temperature. It was then immersed without rinsing into the amine borane plating bath. Nickel was deposited on the copper within 10 seconds, and complete coverage over some 100 individual pads was noted. The part was plated for 45 minutes to deposit 0.2 mils of nickel-boron coating. No plating of the plastic or widening of the conductor pads occurred. Adhesion of the coating was acceptable.

When other boards were processed in a similar manner but with the ammonium persulfate step omitted, no activation occurred; nor was an HCl or $H_2SO_4$ treatment step a suitable replacement. No plating took place when the amine borane step was omitted or if the board was thoroughly rinsed after the amine borane step.

EXAMPLE 2

A series of copper panels (1 × 2 inches) were cleaned in trichloroethylene vapors; then immersed in 20 weight % ammonium persulfate cold (room temperature or about 24° C.) for about 30 seconds; rinsed in distilled water for about 30 seconds; then immersed in a dimethylamine borane solution of 1 gram/liter (pH varies) cold for about 2 minutes; and then immersed without rinsing or delay into a fresh amine borane plating bath at 65° C. Observations are summarized below.

| Dimethylamine Borane Solution pH | Results |
|---|---|
| 3 | no plating |
| 4 | complete coverage within 15 seconds |
| 5 | complete coverage within 15 seconds |
| 6 | complete coverage within 15 seconds |
| 7 | complete coverage within 15 seconds |
| 8 | complete coverage within 15 seconds |
| 9 | complete coverage within 15 seconds |
| 10 | complete coverage within 15 seconds |
| 11 | complete coverage within 15 seconds |

The coatings were allowed to plate for about 5 minutes. Adhesion of the nickel-boron coating to all the copper panels was acceptable.

A control panel was processed as above except that the immersion in a dimethylamine borane solution was omitted. The panel did not plate in the amine borane plating bath even though left in during the successful trials noted above. Another control panel was also processed at the conclusion of the above trials. It was not pretreated in dimethylamine borane solution, and it too did not plate.

This example shows that the dimethylamine borane pretreatment step is responsible for the activation of copper. Omission of the dimethylamine borane step results in no nickel coating taking place. The activation step also is shown to work over a wide range of pH (including acid, neutral and alkaline conditions).

EXAMPLE 3

A glass epoxy circuit board (1 × 4 inches) with copper conductor patterns was processed in the same manner as Example 1 with a 1 gram/liter dimethylamine borane solution of pH 9. It plated within 30 seconds on immersion in the amine borane plating bath. The 100 or so isolated copper conductor lanes were found to be coated in 15 minutes with no coating of the plastic. Omission of the dimethylamine borane step resulted in no nickel plating onto the copper.

This example shows that the copper can be activated by dimethylamine borane even when present as a number of isolated areas.

EXAMPLE 4

A series of copper panels were processed through a cleaning step, an etch step and an activator step and then immersed into a fresh amine borane plating bath at 60° C. for 10 minutes. In the tables, APS means ammonium persulfate, DMAB means dimethylamine borane and SHP means sodium hypophosphite.

| | Cleaning Step | Etch Step | Activator Step | Remarks |
|---|---|---|---|---|
| 1 | Acetone | — | — | no coating, panel lost 0.2 mg |
| 2 | Methanol | 40% HCl, cold 2 mins. | — | no coating, panel lost 0.2 mg |
| 3 | Methanol | 20% APS, cold 15 secs. | — | no coating, panel lost 0.1 mg |
| 4 | Methanol | 20% APS, cold 15 secs. | DMAB, 1 g/l rinsed 1 min. cold | no coating, panel lost 0.2 mg |
| 5 | Methanol | 20% APS, cold 15 secs. | DMAB, 1 g/l 2.5 min., cold pH = 8.8 | coated, panel gained 31.9 mg |

This example shows again the importance of dimethylamine borane for activation and that subtle variations in the process such as thorough rinsing after dimethylamine borane step can lead to nonactivation.

EXAMPLE 5

In these tests, the duration of immersion in the dimethylamine borane solution was varied.

| | Cleaning Step | Etch Step | Activation Step | Remarks |
|---|---|---|---|---|
| 1 | Methanol | 20% APS cold, 15 secs. | DMAB (1 g/l) cold, 1.5 mins. | coated, panel gained 54.7 mg |
| 2 | Methanol | 20% APS cold, 15 secs. | DMAB (1 g/l) cold, 30 secs. | coated, panel gained 60.9 mg |
| 3 | Methanol | 20% APS cold, 15 secs. | DMAB (1 g/l) cold, 40 secs. | coated, panel gained 67.3 mg |
| 4 | Methanol | 20% APS cold, 15 secs. | DMAB (1 g/l) cold, 15 secs. | coated |
| 5 | Methanol | 20% APS cold, 15 | DMAB (1 g/l) cold, | coated |

| Cleaning Step | Etch Step | Activation Step | Remarks |
|---|---|---|---|
| | secs. | 5 secs. | |

This example shows that very little residence time in the dimethylamine borane activator solution is required to activate copper.

EXAMPLE 6

In these tests, the concentration of dimethylamine borane in the activator solution was decreased until it was no longer effective in activating copper.

| Cleaning Step | Etch Step | Activation Step | Remarks |
|---|---|---|---|
| 1 Methanol | 20% APS cold, 15 secs. | DMAB (35 g/l) cold, 1 min. | plates in <5 secs. |
| 2 Methanol | 20% APS cold, 15 secs. | DMAB (17.5 g/l) cold, 1 min. | plates in <5 secs. |
| 3 Methanol | 20% APS cold, 15 secs. | DMAB (8.8 g/l) cold, 1 min. | plates in <5 secs. |
| 4 Methanol | 20% APS cold, 15 secs. | DMAB (4.4 g/l) cold, 1 min. | plates in <5 secs. |
| 5 Methanol | 20% APS cold, 15 secs. | DMAB (2.2 g/l) cold, 1 min. | plates in <5 secs. |
| 6 Methanol | 20% APS cold, 15 secs. | DMAB (1.1 g/l) cold, 1 min. | plates in <5 secs. |
| 7 Methanol | 20% APS cold, 15 secs. | DMAB (0.5 g/l) cold, 1 min. | plates in <5 secs. |
| 8 Methanol | 20% APS cold, 15 secs. | DMAB (0.25 g/l) cold, 1 min | one panel plated; one panel did not plate |
| 9 Methanol | 20% APS cold, 15 secs. | DMAB (0.125 g/l) cold, 1 min. | no plating on 2 panels |

This shows that even dilute dimethylamine borane solutions are capable of activation; the lower limit is between 0.25 and 0.5 g/l dimethylamine borane concentration.

EXAMPLE 7

In this example, a variety of conductive but non-catalytic surfaces was processed by trichloroethylene vapor degreasing, then immersed in a 0.1% dimethylamine borane activator solution (1 gram/liter) cold, 2 minutes, pH 8.5; then into the amine borane plating bath.
 a. Kovar seals
 b. molybdenum-manganese thick-film metallization on alumina ceramic
 c. silver thick-film metallization on glass
 d. electroconductive tin oxide on glass
 e. 316 series stainless steel In all cases, nickel-boron plating of these articles took place within 15 seconds in the bath. Without the dimethylamine borane activator step, none of these articles plated even after 15 minutes in the bath. This shows the wide applicability of the dimethylamine borane activator step.

EXAMPLE 8

In this example, sodium borohydride was tried as an activator for the sodium borohydride bath. Copper panels were used as test substrates.

| Cleaning Step | Etch Step | Activator Step | Remarks |
|---|---|---|---|
| 1 Methanol | 20% APS, cold, 1 min. | — | No plating in 10 minutes in fresh sodium borohydride bath at 92° C. |
| 2 Methanol | 20% APS, cold, 1 min. | SBH, 25.6 g/l cold, 2 mins. | plating in 15 secs. |
| 3 Methanol | 20% APS, cold, 1 min. | SBH, 12.3 g/l cold, 2 mins. | plating in 15 secs. |
| 4 Methanol | 20% APS, cold, 1 min. | SBH, 6.2 g/l cold, 2 mins. | plating in 15 secs. |
| 5 Methanol | 20% APS, cold, 1 min. | SBH, 3.1 g/l cold, 2 mins. | No plating in 10 minutes |
| 6 Methanol | 20% APS, cold, 1 min. | SBH, 5 minutes in bath | No plating in 10 minutes |

This example shows that pretreatment with sodium borohydride is capable of activating nickel-boron coating of copper surfaces.

EXAMPLE 9

In this example, dimethylamine borane was used to activate plating on copper in an acid nickel-phosphorous plating bath. The nickel-phosphorous bath consisted of 30 grams/liter nickel chloride . $6H_2O$, 50 grams/liter sodium hydroxyacetate and 10 grams/liter sodium hypophosphite. The pH of the bath was 5, and the temperature was 90° C.

| Cleaning Step | Etch Step | Activation Step | Remarks |
|---|---|---|---|
| 1 Methanol | 20% APS, cold, 1 min. | — | No plating in 60 mins. in Ni/P bath |
| 2 Methanol | 20% APS, cold, 1 min. | SHP (10 g/l) | No plating |
| 3 Methanol | 20% APS, cold, 1 min. | DMAB (1 g/l) | Plating in 5 secs. |

This example shows that nickel-phosphorous plating on copper can be activated by preimmersion in dimethylamine borane solutions.

COMPARATIVE TEST 1

In this test additional trials were conducted with sodium hypophosphite and hydrazine hydrate reducing agents replacing dimethylamine borane in the activation step.

| Cleaning Step | Etch Step | Activation Step | Remarks |
|---|---|---|---|
| 1 Methanol | 20% APS, cold, 1 min. | SHP (10 g/l) cold, 2 mins. pH 4.5 | No plating |
| 2 Methanol | 20% APS, cold, 1 min. | SHP (10 g/l) cold, 2 mins. pH 4.5 | No plating |
| 3 Methanol | 20% APS, cold, 1 min. | SHP (10 g/l) cold, 2 mins. pH 7.0 | No plating |
| 4 Methanol | 20% APS, cold, 1 min. | SHP (10 g/l) cold, 2 mins. pH 9.0 | No plating |
| 5 Methanol | 20% APS, cold, 1 min. | hydrazine hydrate (50 cc/l) cold, 2 mins. pH 10.8 | No plating |
| 6 Methanol | 20% APS, cold, 1 min. | hydrazine hydrate (50 cc/l) cold, 2 mins. pH 7.0 | No plating |
| 7 Methanol | 20% APS, cold, 1 min. | hydrazine hydrate (50 cc/l) cold, 2 mins. pH 4.4 | No plating |

This test shows the inactivity of these other reducing agents over a reasonable pH range and despite a high solution concentration.

COMPARATIVE TEST 2

In this test, formaldehyde reducing agent replaced the dimethylamine borane in the activation step. Copper panels were used as test substrates.

| Cleaning Step | Etch Step | Activation Step | Remarks |
|---|---|---|---|
| 1 Methanol | 20% APS, cold, 1 min. | Formaldehyde, 50 cc/l., cold, pH 4.3, 2 mins. | No plating in 10 minutes in fresh Sylek 201 bath at 65° C. |
| 2 Methanol | 20% APS, cold, 1 min. | Formaldehyde, 50 cc/l., cold, pH 8.5, 2 mins. | No plating |
| 3 Methanol | 20% APS, cold 1 min. | Formaldehyde, 50 cc/l., cold, pH 10.5, 2 mins. | No plating |

This test shows the inactivity of this reducing agent over a reasonable pH range and despite a high solution concentration.

We claim:

1. A process for plating nickel or cobalt by chemical reduction of a plating bath onto the surface of an electrically conducting material which is normally non-catalytic to the plating bath, said material selected from the group (measured by weight) consisting of
   copper and copper-based alloys containing at least 50% copper,
   iron-based alloys containing at least about 50% iron and 12% chromium,
   an iron-based alloy containing about 29% nickel, 17% cobalt, and the balance essentially iron,
   silver,
   a sintered, fritted composition of oxide powders and at least one metal selected from the group consisting of gold, silver, platinum, and alloys containing at least 50% of one or more of such metals,
   tin oxide compositions containing a small but effective amount of antimony oxide compositions to increase electrical conductivity, and
   a composition consisting essentially of molybdenum, manganese and oxygen,
   which process consists essentially of contacting the surface prior to said plating with a pretreating solution consisting essentially of water and a reducing agent selected from the group consisting of alkali metal borohydrides, alkali metal cyanoborohydrides, and amine boranes, said solution containing at least about 0.5 grams per liter of said reducing agent, and then contacting the surface with the plating bath to cause the chemical reduction of nickel or cobalt onto the surface, provided that when the reducing agent in the pretreating solution is an alkali metal borohydride, an alkali metal borohydride is also used as reducing agent in the plating bath.

2. The process of claim 1 wherein the reducing agent in the pretreating solution is an amine borane.

3. The process of claim 1 wherein the reducing agent in the pretreating solution is dimethylamine borane.

4. The process of claim 1 wherein the reducing agent in the pretreating solution is sodium borohydride.

5. A process for plating nickel according to claim 1 wherein the plating bath includes water, a soluble nickel salt, and a reducing agent containing boron.

6. The process of claim 5 wherein the reducing agent in the plating bath is dimethylamine borane.

7. The process of claim 5 wherein the reducing agent in the plating bath is sodium borohydride.

8. The process of claim 1 wherein the plating bath includes water, a soluble nickel salt, and a reducing agent containing phosphorus.

9. The process of claim 8 wherein the reducing agent in the plating bath is sodium hypophosphite.

10. The process of claim 3 wherein the dimethylamine borane is present in the pretreating solution at a concentration about in the range of 1 to 20 grams/liter.

11. The process of claim 1 wherein the selected material is copper, and the copper is contacted with a solution of an oxidizing agent prior to contacting it with the pretreating solution.

12. The process of claim 11 wherein the reducing agent in the pretreating solution is dimethylamine borane.

13. The process of claim 12 wherein the oxidizing agent is ammonium persulfate.

14. The process of claim 1 wherein the selected material is in the form of an electrically conductive pattern on an electrically nonconductive substrate, with areas of substrate exposed to the surface between and adjacent to areas of the pattern, wherein contact with the pretreating solution causes the selected metal to be plated with nickel in the plating bath, while the electrically nonconductive substrate, which is also contacted by the pretreating solution, is not plated with nickel in the plating bath.

15. The process of claim 14 wherein the selected material is copper, and the substrate is predominately a polymeric material.

16. The process of claim 14 wherein the selected material is a sintered powder composition of molybdenum and manganese oxide, and the substrate is a ceramic material.

17. A process for plating nickel by chemical reduction of a plating bath onto the surface of a pattern of copper on an electrically nonconductive substrate, said pattern and substrate comprising a body, with areas of the substrate exposed to the surface between and adjacent to areas of the pattern, said process comprising the sequential steps of:
  1. immersing said body in an aqueous solution of ammonium persulfate to oxidize the copper portions of the surface followed by rinsing,
  2. immersing said body in an aqueous solution of a reducing agent selected from the group consisting of alkali metal cyanoborohydride and amine boranes, said solution containing at least about 0.5 gram/liter of said reducing agent to treat the copper portions on the surface to make them catalytic to the following plating bath, and then
  3. immersing said body in a plating bath which is an aqueous solution comprising nickel acetate and dimethylamine borane to deposit a coating of nickel on the copper portions of the surface and leave the electrically nonconductive areas of the substrate unplated.

18. The process of claim 17 wherein in Step 2, the reducing agent is present at a concentration of about in the range of 1 to 20 grams/liter, the temperature is about in the range of 25° to 65° C., and the pH is about in the range of 3.5 to 11.0.

19. The process of claim 17 wherein the conductor pattern consists of separated and discontinuous areas.

20. The process of claim 17 wherein the reducing agent in the pretreating solution is dimethylamine borane.

* * * * *